United States Patent [19]

Hafizi et al.

[11] Patent Number: 5,468,659
[45] Date of Patent: Nov. 21, 1995

[54] REDUCTION OF BASE-COLLECTOR JUNCTION PARASITIC CAPACITANCE OF HETEROJUNCTION BIPOLAR TRANSISTORS

[75] Inventors: Madjid Hafizi, Santa Monica; William E. Stanchina, Thousand Oaks; William W. Hooper, Westlake Village, all of Calif.

[73] Assignee: Hughes Aircraft Company, Los Angeles, Calif.

[21] Appl. No.: 209,339

[22] Filed: Mar. 10, 1994

[51] Int. Cl.[6] ......................... H01L 21/265; H01L 21/20
[52] U.S. Cl. ................................................ 437/31; 437/133
[58] Field of Search ........................ 437/31, 133; 257/14, 257/15, 16, 17, 18, 19, 22, 25, 26, 586, 197, 198

[56] References Cited

U.S. PATENT DOCUMENTS

| 4,731,340 | 3/1988 | Chang et al. | 437/31 |
|---|---|---|---|
| 5,037,769 | 8/1991 | Inada et al. | 437/31 |
| 5,051,372 | 9/1991 | Sasaki | 437/133 |
| 5,243,207 | 9/1993 | Plumton et al. | 257/198 |
| 5,272,095 | 12/1993 | Enquist et al. | 437/31 |
| 5,296,389 | 3/1994 | Shimawaki | 437/31 |
| 5,332,912 | 7/1994 | Nozu et al. | 257/197 |
| 5,378,901 | 1/1995 | Nii | 257/198 |

OTHER PUBLICATIONS

Mau-Chung F. Chang et al, "AlGaAs/GaAs Heterojunction Bipolar Transistors Fabricated Using A Self-Aligned Dual-Lift-Off Process", IEEE Electron Device Letters, vol. EDL-8, No. 7, pp. 303–305 (Jul. 1987).

T. R. Followan et al, "High Yield Scalable Dry Etch Process for Indium Based Heterojunction Bipolar Transistors", Proceedings of InP and Related Materials Conference, WP15, pp. 343–346 (1992).

*Primary Examiner*—Olik Chaudhuri
*Assistant Examiner*—Brian K. Dutton
*Attorney, Agent, or Firm*—V. D. Duraiswamy; W. K. Denson-Low

[57] ABSTRACT

A photoresist process combined with wet chemical etching and silicon oxide evaporation and self-aligned lift-off is used to reduce the parasitic (extrinsic) base-collector junction capacitance ($C_{BC}$) of InP-based heterojunction bipolar transistors (HBTs). At least a portion of the mesa related to the base contact is etched around the intrinsic device area and then back-filled with evaporated oxide. The base contact pad is then formed over the back-filled oxide, thus reducing the extrinsic device area. This process provides a self-aligned etching of a mesa and deposition and lift-off of the back-fill oxide in one single photoresist processing step. The process is simple and reproducible and provides very high yield. It also eliminates the need for costly and complicated dry-etching techniques.

8 Claims, 4 Drawing Sheets

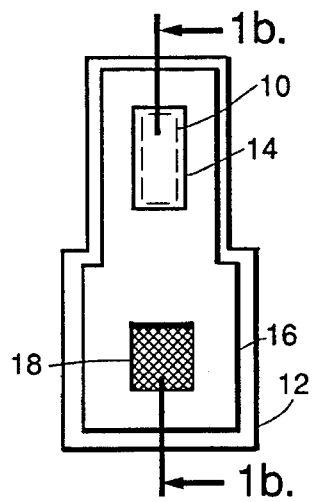
FIG. 1a.
(PRIOR ART)
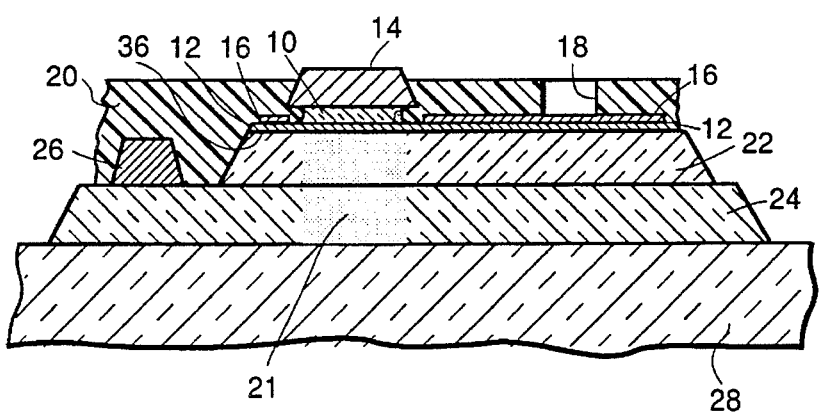
FIG. 1b.
(PRIOR ART)
FIG. 2a.
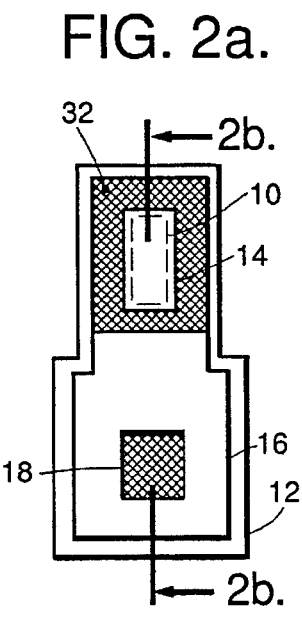
FIG. 2b.
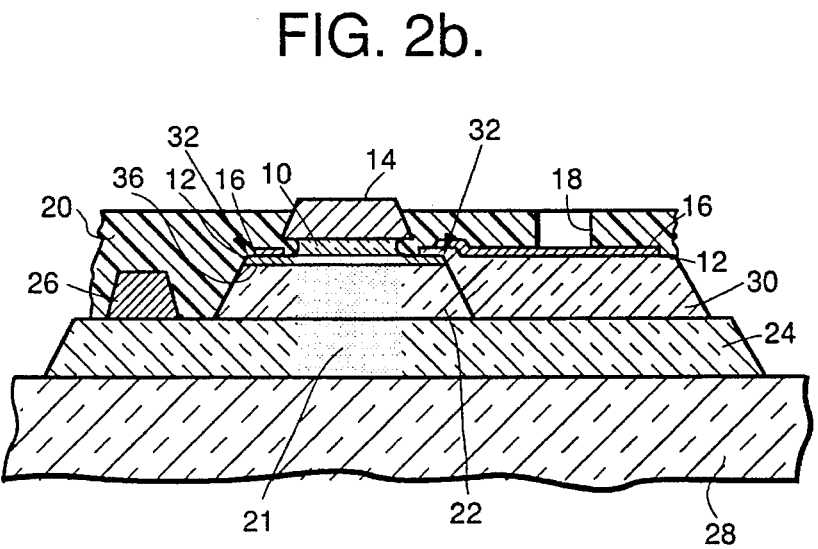

REDUCTION OF BASE-COLLECTOR JUNCTION PARASITIC CAPACITANCE OF HETEROJUNCTION BIPOLAR TRANSISTORS

BACKGROUND OF THE INVENTION

1. Field of the Invention

The present invention relates generally to bipolar transistors, specifically, heterojunction bipolar transistors, and, more particularly, to methods for reducing the base-collector junction parasitic capacitance of such transistors.

2. Description of Related Art

In a heterojunction bipolar transistor (HBT) device mesa structure, the intrinsic region of the device is determined by the emitter geometry. The transistor action in the intrinsic region of the device takes place in a volume directly under the emitter contact. The base-emitter (B-E) junction area, which is defined by mesa etching down to the base surface, determines the lateral cross-section of the intrinsic device. However, for contacting to the base terminal, the base mesa, which defines the base-collector (BC) junction area, is made larger than the B-E junction area, often over twice as large. Making the B-C junction area substantially larger than the B-E junction area leads to a large extrinsic B-C capacitance $C_{BC}$, which is undesirable.

A number of attempts have been made to correct this problem. In one approach to solve the problem, buried-implant damage is used to reduce the extrinsic portion of the $C_{BC}$; see, e.g., Mau-Chung F. Chang et al, "AlGaAs/GaAs Heterojunction Bipolar Transistors Fabricated Using a Self-Aligned Dual-Lift-Off Process", IEEE Electron Device Letters, Vol. EDL-8, No. 7, pp. 303–305 (July 1987). In the case of GaAlAs/GaAs HBTs, the buried ion-implantation technique neutralizes the parasitic portion of the CBC (i.e., the area of the junction which is not directly under the emitter). In this approach, oxygen or boron is used to damage the GaAs collector region contributing to the parasitic portion of the $C_{BC}$.

However, in the case of a GaInAs collector used in AlInAs/GaInAs HBT devices, no ion-implant procedure exists that can adequately damage GaInAs and thus reduce the extrinsic portion of the $C_{BC}$. Therefore, this procedure is not applicable to AlInAs/GaInAs HBTs.

In general, the buried ion-implant procedure is also costly because of the need for an ion implanter and it is complicated because it requires extensive development. Furthermore, even in the case of GaAs-based HBTs where buried implantation damage is possible, there are a number of drawbacks to this technique. This process requires an elaborate ion-implantation facility and process. In addition, it results in a number of adverse side effects, including severe reduction in the current gain as well as potential long-term reliability problems for the devices.

In another approach to solve the problem, dry-etching techniques are employed; see, e.g., T. R. Followan et al, "High Yield Scalable Dry Etch Process for Indium Based Heterojunction Bipolar Transistors", Proceedings of InP and Related Materials Conference, WP15, pp. 343–346 (1992). However, there are several drawbacks to using dry-etching in attempt to reduce the extrinsic portion of the $C_{BC}$. Cost and complexity of the process is one major drawback. Second, it is generally difficult to use photoresist as a mask for dry-etching of GaInAs. Third, the mask that is used to etch the GaInAs is not suitable for lift-off of the evaporated oxide because it does not have the proper profile for lift-off.

Even if the lift-off was possible, there will be a gap formed between the back-filled oxide and the mesa which will cause a short between the base and collector when base metal runs over it. Therefore, a second masking step is required to do the oxide evaporation and lift-off, however, the second masking step is an extra processing step and is not "self-aligned" to the etched mesa. Therefore, it requires the usual alignment tolerances which results in a larger mask. A larger mask increases the extrinsic base-collector area, and thus, increases the $C_{BC}$.

Thus, there remains a need for a process of reducing the base-collector capacitance in heterojunction bipolar transistors that does not suffer from the disadvantages of the prior art approaches.

SUMMARY OF THE INVENTION

In accordance with the invention, a photoresist process combined with wet chemical etching and silicon oxide evaporation and self-aligned lift-off is used to reduce the parasitic (extrinsic) base-collector junction capacitance ($C_{BC}$) of bipolar transistors, for example, AlInAs/GaInAs heterojunction bipolar transistors (HBTs). At least a portion of the mesa related to the base contact is etched around the intrinsic device area and then back-filled with evaporated oxide. The base contact pad is then formed over the back-filled oxide, thus reducing the extrinsic device area. This process provides a self-aligned etching of a mesa and deposition and lift-off of the back-fill oxide in one single photoresist processing step. The process is simple and reproducible and provides very high yield. It also eliminates the need for costly and complicated dry-etching techniques.

The purpose of the process of the present invention is to improve the maximum frequency of oscillation ($f_{max}$) of HBTs and reduce the "RC" time constant in integrated circuit applications. The value of $f_{max}$ is inversely proportional to the square root of $C_{BC}$. The process of the present invention will reduce the $C_{BC}$ by half for a typical HBT device made with $2 \times 3$ $\mu m^2$ emitter geometry. This in turn will increase the $f_{max}$ by a factor of about 1.4.

The present invention avoids the problems associated with the buried ion-implantation technique and permits processing of AlInAs/GaInAs HBTs. The present invention also avoids the problems associated with dry etching. Specifically, a major feature of the present invention is that the lift-off of the evaporated oxide is self-aligned with the base mesa etch and the process is done by one single photoresist masking step.

BRIEF DESCRIPTION OF THE DRAWINGS

FIG. 1a is a top plan view of emitter and base mesas and emitter and base contacts for a prior art heterojunction bipolar transistor;

FIG. 1b, taken along the line 1b–1b of FIG. 1a, is a cross-sectional view of the device depicted in FIG. 1a;

FIG. 2a is a top plan view of emitter and base mesas and emitter and base contacts with a partial base etch and $SiO_x$ backfill in accordance with one embodiment of the present invention;

FIG. 2b, taken along the line 2b–2b of FIG. 2a, is a cross-sectional view of the device depicted in FIG. 2a;

FIG. 4b, taken along line 4b–4b of FIG. 4a, is a cross-sectional view of the device depicted in FIG. 4a.

DESCRIPTION OF THE PREFERRED EMBODIMENTS

Figure 3A:
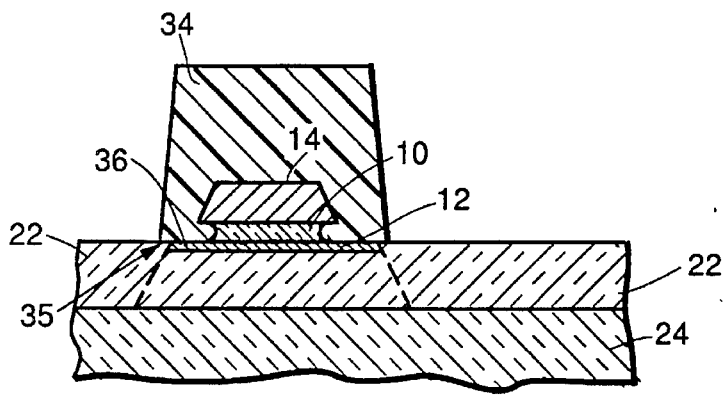
FIGS. 3a–d are cross-sectional views depicting the sequence of process steps for base-collector etching and $SiO_x$ deposition to form the device depicted in FIGS. 2a–b, in accordance with the present invention.

Turning now to the drawings, wherein like numerals depict like elements throughout, the relevant portions of a prior art HBT device are shown in FIGS. 1a–b.

FIG. 1a depicts a top view of emitter and base mesas 10, 12, respectively as well as their respective contacts 14, 16. It can be seen that to accommodate a via 18 (seen in FIG. 1b) to the base contact 16 through a polyimide layer 20 (not shown in FIG. 1a), the base-collector (B-C) junction area is made substantially larger than the base-emitter (B-E) junction area, leading to a large extrinsic B-C capacitance. The vertical projection of the B-E junction region is shown shaded in FIG. 1b and is denoted 21. The area within the shaded region 21 gives rise to the instrinsic B-C capacitance and the area outside the shaded region gives rise to the extrinsic B-C capacitance. It is the extrinsic portion of the $C_{BC}$ (outside region 21) which is reduced substantially in the present invention by simple processing techniques, outlined below.

For completeness the collector layer 22 is also shown in FIG. 1b, with electrical contact made thereto through a sub-collector layer 24, which is contacted by collector metal 26. The collector metal contact 26 is not shown in FIG. 1a. This portion of the device is not relevant to the discussion relating to the base-collector junction area, and thus is not described further.

The polyimide layer 20 is blanket-deposited everywhere and is etched back so as to expose the top portion of the emitter metal contact 14. The via 18 is then formed therethrough to expose a portion of the base metal contact 16. The metal interconnect to the base metal contact 16 is not shown, nor are the via and metal interconnect to the collector metal contact 26.

The entire structure is supported on a semi-insulating InP substrate 1B. As is conventional, the collector 22 comprises GaInAs or InP, the base 12 comprises GaInAs, the emitter 10 comprises AlInAs or InP, and the sub-collector 24 comprises GaInAs. The sub-collector 24 is heavily doped for making ohmic contact between the collector layer 22 and the collector metal contact 26. The sub-collector layer 24 also reduces the collector series resistance. The collector metal 26 contact comprises AuGe/Ni/Au and the base metal 16 and emitter metal 14 contacts comprise Ti/Pt/Au, as is conventional.

In accordance with the teachings of the present invention, that portion of the base contact 16 which has been enlarged to accommodate the via 18 is placed over a silicon oxide layer in order to significantly reduce the corresponding portion of the $C_{BC}$. To achieve this cutback in the $C_{BC}$, two embodiments are disclosed as follows. The first embodiment is termed "partial base etch and $SiO_x$ backfill" and the second is termed "$SiO_x$ plug option". Common to both techniques is etching at least a part ($SiO_x$ plug) or all (partial base etch and $SiO_x$ backfill) of that portion of the mesa associated with the base 12 that extends beyond the emitter area and filling in the etched portion with an evaporated dielectric, preferably with an oxide, specifically, silicon oxide. Alternatively, silicon nitride may be employed in place of silicon oxide.

As used herein, $SiO_x$ refers to silicon oxide, where the value of x is 2 or less. Such non-stoichiometric silicon oxide films are obtained by evaporation of silicon oxide, as is well-known. Since there is no source of silicon available with these III–V HBTs, evaporation of silicon oxide is a well-known approach to forming silicon oxide films for later lift-off. In contrast, thermal growth of silicon oxide from silicon generally results in a value of x=2.

1. Partial Base Etch and $SiO_x$ Backfill

The first embodiment is schematically described in FIGS. 2a–b and 3a–d. FIGS. 3a–d are slightly enlarged compared to FIGS. 2a–b for clarity.

In the approach of this first embodiment, the base 16 and the collector 22 are etched first, then a layer 30 of $SiO_x$ is evaporated to a thickness comparable to that of the etched depth. FIG. 2a is a top view of the HBT structure of the present invention, which incorporates the B-C etch followed by $SiO_x$ 30 backfill. It will be seen in FIG. 2a that the boundaries of the shaded region designated 32, which refer to "B-C etch and $SiO_x$ protect", define the B-C junction that remains after being significantly reduced by the present invention compared to the area shown in FIGS. 1a–b (contained within 12).

The cross-sectional view of the device of the present invention is shown in FIG. 2b. In FIG. 2b, the deposition of $SiO_x$ 30 into the etched B-C region is shown. It can be seen that the extrinsic portion of the B-C junction is substantially reduced, resulting in reduction of the $C_{BC}$.

The processing sequence for the first approach is as follows: FIGS. 3a–d show a schematic process flow for implementation of the present invention. Conventional processing is used to define the emitter metal 14 and etch the emitter mesa 10 down to the surface of the base 12. At this point, as shown in FIG. 3a, a photoresist layer 34 is patterned and the base 12 and the collector 22 are etched to reach the sub-collector 24 or at least into the collector beyond the base-collector p-n junction 36. In this step, a conventional wet chemical etching process is used which is convenient and well-understood. The depth of the wet chemical etching can be easily monitored by step profiling techniques. The etch results in a finite undercut, designated as 35 in FIG. 3A, of the photoresist 34, which is characteristic of any etch whether wet or dry (in wet etching; however, the extent of undercut is more profound than in dry-etching; dry-etching chemistry can be designed to significantly reduce, but not eliminate, the undercut). This undercut 35 is undesirable to subsequent processing because it would result in shorting of the base and collector terminals of the device when the base metal is deposited, as will become clear shortly.

Figure 3B:
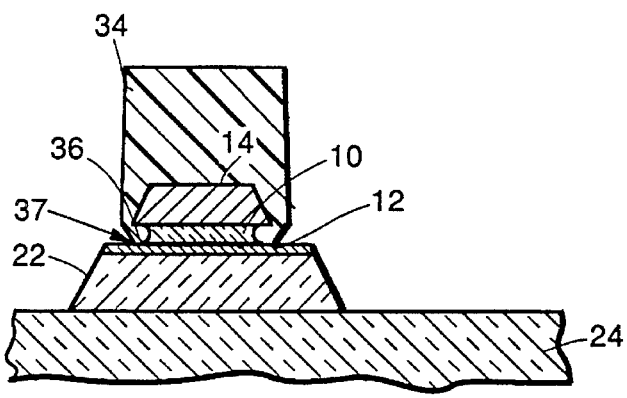
Figure 3C:
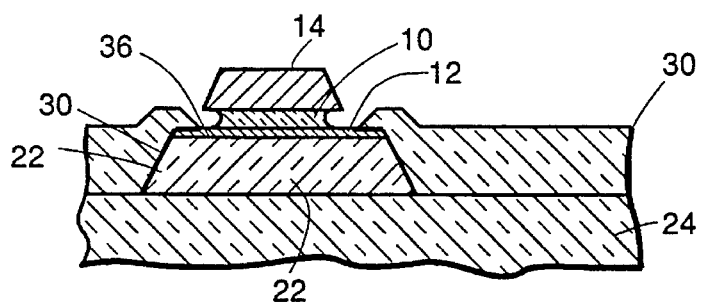

In the next step, plasma etching is used to shrink the profile of the photoresist 34, as depicted in FIG. 3b. The edges of the photoresist are now inside the etched B-C mesa 22. The plasma etching process is optimally performed in an oxygen plasma with a pressure of 0.7 Torr and a flow rate of 20 sccm and RF power of 500 W. The plasma etching causes an undercut 37 shown in FIG. 3b. The undercut 37 is essential for lifting off the evaporated oxide in the next step. Without this undercut, the oxide will either not lift-off at all or it will lift-off partially with uneven edges and with a low yield. Next, the layer of $SiO_x$ 30 is evaporated and those silicon oxide portions on the photoresist layer 34 are lifted off. This process uses the same photoresist 34 that was used during etching of the base-collector mesa to protect the base-emitter mesa. This process results in a self-aligned deposition which minimizes the dimensions (and therefore, minimizes the $C_{BC}$) and would result in good processing yield. The $SiO_x$ 30 that fills the etched mesa is shown in FIG. 3c. The deposition of the $SiO_x$ layer 30 is conventional and employs evaporation techniques well-known in this art.

Figure 3D:
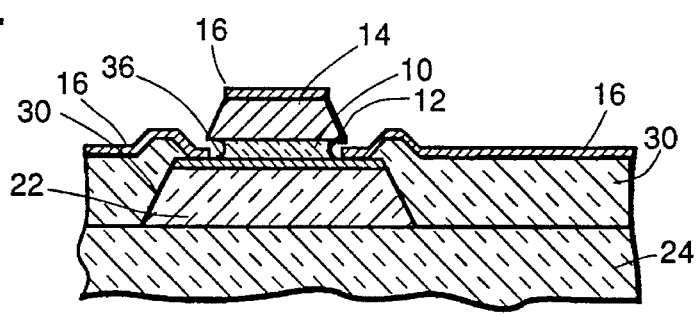
Figure 4A:
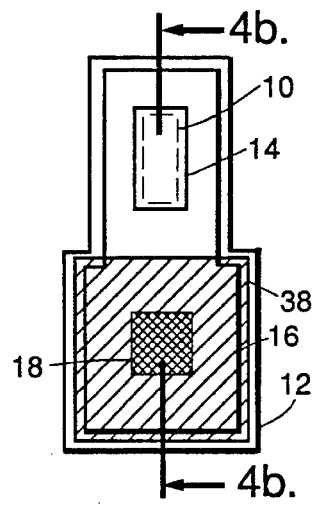
FIG. 4a is a top plan view of emitter and base mesas and emitter and base contacts with a $SiO_x$ "plug" in accordance with another embodiment of the present invention.
Figure 4B:
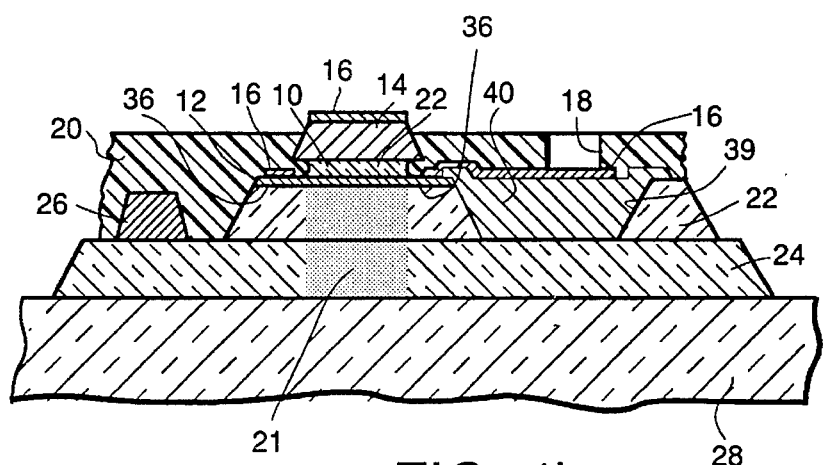

It can be seen that the $SiO_x$ 30 overlaps the base 12 to ensure that in the next process step during deposition of the base metal 16, the base and collector terminals of the device are not shorted. Conventional processing is resumed to pattern photoresist and evaporate and lift off the base metal 16 as shown in FIG. 3d. It can be seen that at the edge of the B-C mesa, the base metal 16 overlaps the $SiO_x$ layer 30, which in turn overlaps the base 12. This $SiO_x$ overlap ensures that the base and collector terminals of the device are not shorted by the base metal.

SEM micrographs (not shown) of actual devices fabricated using the process of the present invention provide pictorial evidence of the details of the process.

$SiO_x$ Plug Option.

An alternative approach is shown in FIGS. 4a–b and 5a–d. In this approach, which is named "$SiO_x$ Plug", an opening 38 is etched in the area where the base contact will be made. This is shaded in FIG. 4a. Subsequently, the opening 38 is filled with $SiO_x$ 40 and the base metal 16 is deposited over it (see FIG. 4b), identical to the first approach. A corresponding process flow is shown in FIGS. 5a–d.

Figure 5A:
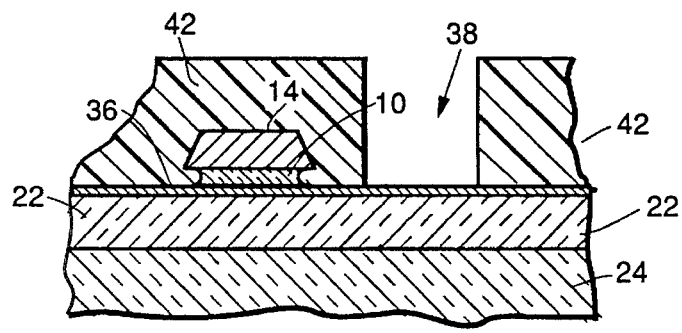
FIGS. 5a–d are cross-sectional views depicting the sequence of process steps for base collector etching and $SiO_x$ deposition to form the device depicted in FIGS. 4a–b, in accordance with the present invention.
Figure 5B:
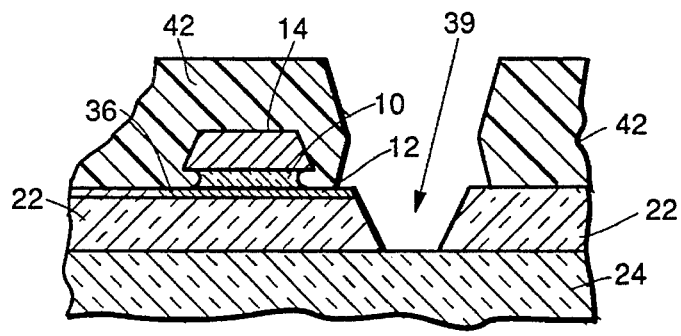
Figure 5C:
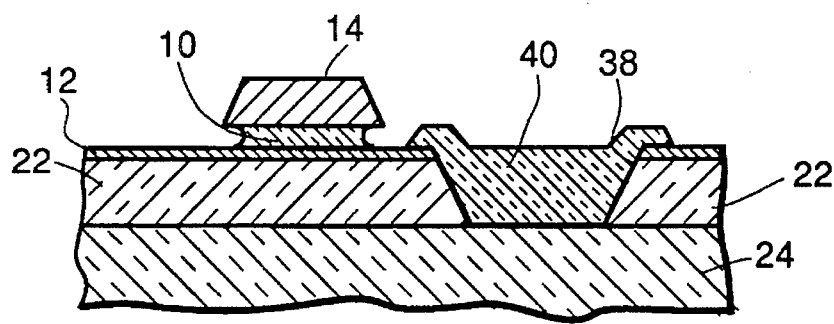
Figure 5D:
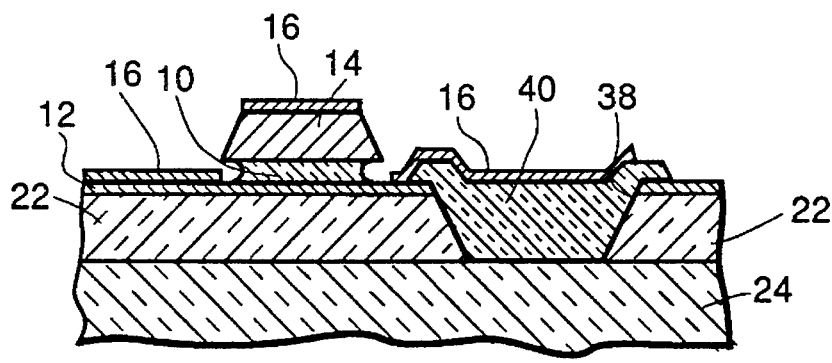

Initially, a layer 42 of photoresist is patterned to define the open, or plug, area 38, as shown in FIG. 5a. The recess 39 is then formed by etching and the photoresist 42 is plasma-etched to shrink it, as shown in FIG. 5b. Alternatively, a second photoresist mask with an opening larger than region 39 may be used to mask the $SiO_x$ evaporation for lift-off. Next, $SiO_x$ 40 is evaporated and the silicon oxide portions on the photoresist layer 42 are lifted off, leaving the structure shown in FIG. 5c. It will be seen that the $SiO_x$ 40 overlaps the edges of the opening 38. Finally, the base metal 16 is deposited and patterned by lifting off, as shown in FIG. 5d. It will be seen that the base metal 16 overlaps the $SiO_x$ 40, which in turn overlaps the edges of the opening 38 to ensure that there are no shorts between the base and collector terminals of the device.

SEM micrographs (not shown) of actual fabricated devices provide pictorial evidence of the process of the invention.

The present invention results in reduced $C_{BC}$ and improved $f_{max}$ for HBTs and can be extended to any similar structure in which a reduction of extrinsic parasitic capacitance is important. For power amplification, high $f_{max}$ translates into higher power gain at a given frequency which can also be traded away for higher power added efficiency. For small signal applications (digital and analog-integrated circuits), the product of $C_{BC}$ ($R_L \leftrightarrows R_B$), where $R_L$ and $R_B$ are load- and base-resistances, respectively, is a major time constant determining the speed of these circuits. In particular, The process of the present invention reduces the $C_{BC}$ by half for a typical HBT device made with $2\times3$ μm² emitter geometry. This in turn increases the $f_{max}$ by a factor of about 1.4.

The reduction in the $C_{BC}$ is even more profound when the emitter dimensions are scaled down to sub-micrometer values. Scaled emitter devices in the sub-micrometer range are essential for low-power integrated circuit applications.

Thus, there has been disclosed a process for the reduction of base-collector junction parasitic capacitance of heterojunction transistors. It will be readily apparent to those skilled in the art that various changes and modifications of an obvious nature may be made, and all such changes and modifications are considered to fall within the scope of the present invention as defined by the appended claims.

What is claimed is:

1. A method for providing a base-collector junction area that is approximately the same as a base-emitter junction area in a heterojunction bipolar transistor comprising (1) a substrate, (2) a collector layer formed on said substrate, an electrical contact to said collector layer, a base layer formed on said collector layer, an electrical contact to said base layer, an emitter layer formed on said base layer, and an electrical contact to said emitter layer, said collector layer extending away from said emitter layer so as to support said electrical contact to said base layer, said method comprising:

(a) removing all of said base layer and said collector layer that extend away from said emitter layer to leave an unfilled volume;

(b) backfilling said unfilled volume with a dielectric material; and (c) depositing said electrical contact to said base layer on said dielectric material, wherein prior step (a), a photoresist layer is formed over at least said electrical contact to said emitter layer and over said emitter layer and said base layer, said photoresist layer is patterned to protect said electrical contact to said emitter layer and over said emitter layer and said base layer, and prior to step (b), said photoresist layer is treated so as to shrink its volume and form an undercut portion which allows subsequent lift-off of said dielectric material.

2. The method of claim 1 wherein said dielectric material comprises silicon oxide.

3. The method of claim 1 wherein said substrate comprises semi-insulating InP.

4. The method of claim 1 wherein said dielectric material extends out of said unfilled volume and overlaps a portion of said base layer.

5. The method of claim 1 wherein during said backfilling step, said dielectric material is deposited every where and is then lifted off areas protected by said photoresist layer.

6. A method for providing a base-collector junction area that is approximately the same as a base-emitter junction area in a heterojunction bipolar transistor comprising (1) a substrate, (2) a collector layer formed on said substrate, an electrical contact to said collector layer, a base layer formed on said collector layer, an electrical contact to said base layer, an emitter layer formed on said base layer, and an electrical contact to said emitter layer, said collector layer extending away from said emitter layer so as to support said electrical contact to said base layer, said method comprising:

(a) removing all of said base layer and said collector layer that extend away from said emitter layer to leave an unfilled volume;

(b) backfilling said unfilled volume with silicon oxide; and (c) depositing said electrical contact to said base layer on said silicon oxide, wherein prior to step (a), a photoresist layer is formed over at least said electrical contact to said emitter layer and over said emitter layer and said base layer, said photoresist layer is patterned to protect said electrical contact to said emitter layer and over said emitter layer and said base layer, and during aid backfilling step said silicon oxide is deposited everywhere and is then lifted off areas protected by said photoresist layer.

7. A method for providing a base-collector junction area that is approximately the same as a base-emitter junction area in a heterojunction bipolar transistor comprising (1) a substrate, (2) a collector layer formed on said substrate, an electrical contact to said collector layer, a base layer formed on said collector layer, an electrical contact to said base layer, an emitter layer formed on said base layer, and an electrical contact to said emitter layer, said collector layer extending away from said emitter layer so as to support said electrical contact to said base layer, said method comprising:

(a) removing a portion of said collector layer that extends away from said emitter layer and said base layer formed on said portion of said collector layer to leave an unfilled volume, said unfilled volume being formed in an area in which said electrical contact to said base is to be made;

(b) filling said unfilled volume with silicon oxide to form a plug, wherein said silicon oxide extends out of said unfilled volume and overlaps a portion of said base layer; and (c) depositing said electrical contact to said base layer on said silicon oxide, wherein prior to step (a), a photoresist layer is blanket deposited, and a portion of said photoresist layer is removed to expose a portion of said base layer and collector layer, and prior to step (b), said photoresist layer is treated so as to shrink its volume and form an undercut portion which allows subsequent lift-off of said silicon oxide.

8. A method for providing a base-collector junction area that is approximately the same as a base-emitter junction area in a heterojunction bipolar transistor comprising (1) a substrate, (2) a collector layer formed on said substrate, an electrical contact to said collector layer, a base layer formed on said collector layer, an electrical contact to said base layer, an emitter layer formed on said base layer, and an electrical contact to said emitter layer, said collector layer extending away from said emitter layer so as to support said electrical contact to said base layer, said method comprising:

(a) removing a portion of said collector layer that extends away from said emitter layer and said base layer formed on said portion of said collector layer to leave an unfilled volume, said unfilled volume being formed in an area in which said electrical contact to said base is to be made;

(b) filling said unfilled volume with silicon oxide to form a plug, wherein said silicon oxide extends out of said unfilled volume and overlaps a portion of said base layer; and (c) depositing said electrical contact to said base layer on said silicon oxide, wherein prior to step (a), a photoresist layer is blanket deposited, a portion of said photoresist layer is removed to expose a portion of said base layer and collector layer, and during said backfilling step, said silicon oxide is deposited everywhere and is then lifted off areas protected by said photoresist layer.

\* \* \* \* \*